United States Patent
Chen et al.

(10) Patent No.: US 9,160,352 B1
(45) Date of Patent: Oct. 13, 2015

(54) PHASE-LOCKED LOOP AND METHOD FOR CONTROLLING THE SAME

(71) Applicant: United Microelectronics Corp., Hsinchu (TW)

(72) Inventors: Po-Hua Chen, Changhua County (TW); Yu-Yee Liow, Hsinchu County (TW); Wen-Hong Hsu, Hsinchu (TW); Hsueh-Chen Cheng, Hsinchu County (TW); Ya-Nan Mou, Hsinchu (TW); Yuan-Hui Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 18 days.

(21) Appl. No.: 14/287,772

(22) Filed: May 27, 2014

(51) Int. Cl.
*H03L 7/06* (2006.01)
*H03L 7/099* (2006.01)
*H03L 7/08* (2006.01)
*H03L 7/085* (2006.01)

(52) U.S. Cl.
CPC ............ *H03L 7/0992* (2013.01); *H03L 7/0802* (2013.01); *H03L 7/085* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,407,600 B1 * | 6/2002 | Lu et al. | 327/156 |
| 7,230,495 B2 * | 6/2007 | Lee et al. | 331/16 |
| 7,466,174 B2 * | 12/2008 | Tirumalai et al. | 327/156 |
| 7,479,814 B1 * | 1/2009 | Kaviani et al. | 327/156 |
| 8,354,866 B2 * | 1/2013 | Jain et al. | 327/142 |
| 8,872,556 B1 * | 10/2014 | Chen et al. | 327/157 |
| 2005/0127964 A1 * | 6/2005 | Lee | 327/158 |
| 2009/0153203 A1 * | 6/2009 | Okamoto et al. | 327/156 |
| 2010/0271137 A1 * | 10/2010 | Kythakyapuzha et al. | 331/16 |
| 2011/0102092 A1 * | 5/2011 | Raita | 331/108 C |
| 2014/0002152 A1 * | 1/2014 | Terrovitis | 327/157 |
| 2014/0320184 A1 * | 10/2014 | Chen et al. | 327/157 |
| 2014/0361817 A1 * | 12/2014 | Jovenin et al. | 327/156 |

OTHER PUBLICATIONS

Po-Hua Chen et al., "VCO Restart up Circuit and Method Thereof", U.S. Appl. No. 14/153,919, filed Jan. 13, 2014, Unpublished.

* cited by examiner

*Primary Examiner* — Adam Houston
(74) *Attorney, Agent, or Firm* — J.C. Patents

(57) ABSTRACT

A phase-locked loop (PLL) and a method for controlling the PLL are provided. The PLL includes a phase detector, a charge pump, a voltage-controlled oscillator (VCO), a feedback frequency divider, and a detector circuit. The phase detector generates a direction signal according to a comparison between phases of a first clock signal and a second clock signal. The charge pump converts the direction signal into a control voltage. The VCO generates a third clock signal. The control voltage controls a frequency of the third clock signal. The feedback frequency divider divides the frequency of the third clock signal to generate the second clock signal. The detector circuit sends a pulse signal to restart the VCO when the control voltage conforms to a preset condition.

12 Claims, 4 Drawing Sheets

PHASE-LOCKED LOOP AND METHOD FOR CONTROLLING THE SAME

BACKGROUND OF THE INVENTION

1. Field of Invention

This invention relates to a phase-locked loop (PLL) and a method for controlling the PLL, and particularly relates to restarting a voltage-controlled oscillator (VCO) of the PLL.

2. Description of Related Art

FIG. 1 schematically illustrates a conventional PLL 100. The PLL 100 includes a phase detector 110, a charge pump 120, a low-pass filter 130, a VCO 140, a feedback frequency divider 150, and an output frequency divider 160. Due to the feedback frequency divider 150 and the output frequency divider 160, the PLL 100 is capable of generating an output clock signal CLKB with arbitrary frequency based on an input clock signal CLKA.

The PLL 100 needs a power down signal PD to reset the PLL 100 and starts up the VCO 140 initially in order to avoid a non-oscillating mode of the PLL 100. In the non-oscillating mode, the output of the VCO 140 does not oscillate and therefore the PLL 100 does not work.

It is possible that the PLL 100 enters the non-oscillating mode in runtime after the initial startup. In this situation, the power down signal PD may be sent to restart the charge pump 120, the low-pass filter 130, and the VCO 140 to resume the normal operation of the PLL 100. However, such a restart is slow because several elements of the PLL 100 have to be restarted. In addition, the power down signal PD is an external signal. The power down signal PD is not generated by any internal signal of the PLL 100. Therefore, the power down signal PD is slow in response and cannot restart the oscillation of the PLL 100 in real time.

SUMMARY OF THE INVENTION

This invention provides a PLL and a method for controlling the PLL to solve the problem caused by the slow response of the external power down signal.

The PLL provided by this invention includes a phase detector, a charge pump, a VCO, a feedback frequency divider, and a detector circuit. The phase detector generates a direction signal according to a comparison between phases of a first clock signal and a second clock signal. The charge pump is coupled to the phase detector. The charge pump converts the direction signal into a control voltage. The VCO is coupled to the charge pump. The VCO generates a third clock signal. The control voltage controls a frequency of the third clock signal. The feedback frequency divider is coupled to the phase detector and the VCO. The feedback frequency divider divides the frequency of the third clock signal to generate the second clock signal. The detector circuit is coupled to the charge pump and the VCO. The detector circuit sends a pulse signal to restart the VCO when the control voltage conforms to a preset condition.

The method for controlling a PLL provided by this invention includes the following steps: generating a direction signal according to a comparison between phases of a first clock signal and a second clock signal; converting the direction signal into a control voltage, wherein the control voltage controls a frequency of a third clock signal generated by a VCO of the PLL; dividing the frequency of the third clock signal to generate the second clock signal; and sending a pulse signal to restart the VCO when the control voltage conforms to a preset condition.

In order to make the aforementioned and other objects, features and advantages of the present invention comprehensible, a preferred embodiment accompanied with figures is described in detail below.

DESCRIPTION OF EMBODIMENTS

Figure 1:
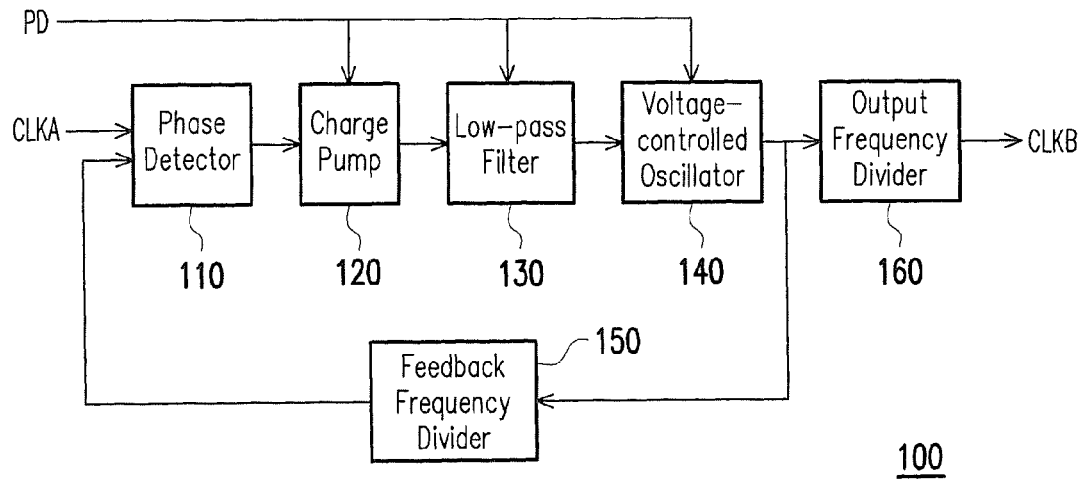
FIG. 1 schematically illustrates a conventional PLL.
Figure 2:
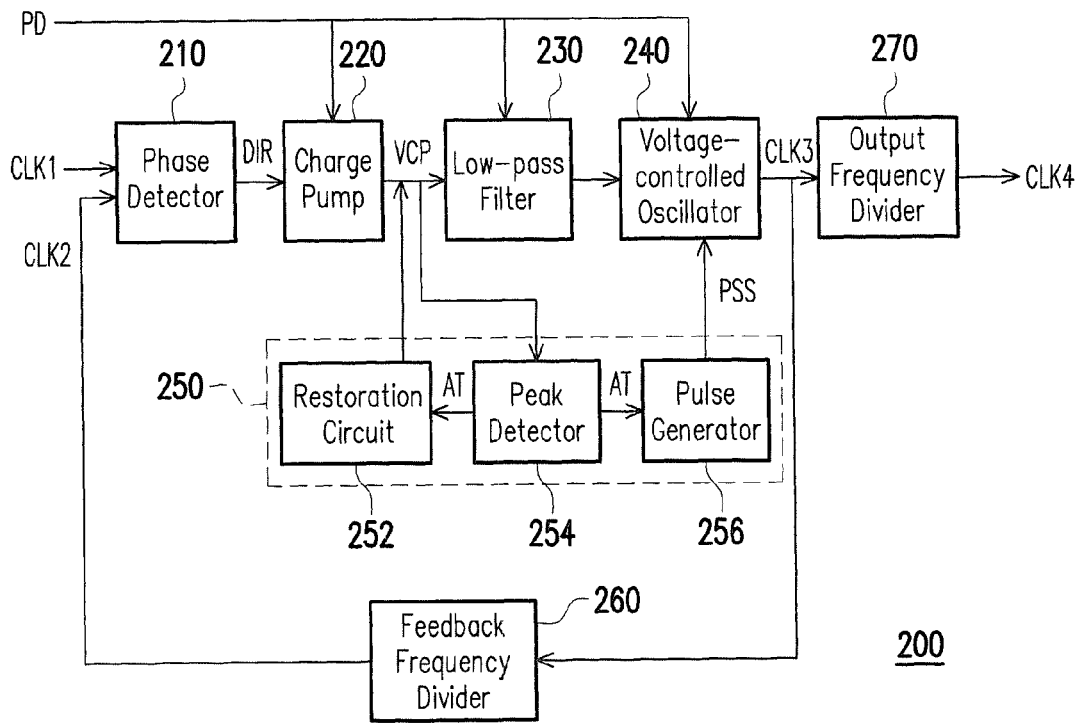
FIG. 2 schematically illustrates a PLL according to an embodiment of this invention.

FIG. 2 schematically illustrates a PLL 200 according to an embodiment of this invention. The PLL 200 includes a phase detector 210, a charge pump 220, a low-pass filter 230, a VCO 240, a detector circuit 250, a feedback frequency divider 260, and an output frequency divider 270. The phase detector 210 generates a direction signal DIR according to a comparison between phases of a first clock signal CLK1 and a second clock signal CLK2. The charge pump 220 is coupled to the phase detector 210. The charge pump 220 converts the direction signal DIR into a control voltage VCP. The low-pass filter 230 is coupled to the charge pump 220. The low-pass filter 230 filters out high frequency noises from the control voltage VCP so that the control voltage VCP is more stable. The VCO 240 is coupled to the low-pass filter 230. The VCO 240 generates a third clock signal CLK3. The control voltage VCP controls the frequency of the third clock signal CLK3. The feedback frequency divider 260 is coupled to the phase detector 210 and the VCO 240. The feedback frequency divider 260 divides the frequency of the third clock signal CLK3 to generate the second clock signal CLK2. The output frequency divider 270 is coupled to the VCO 240. The output frequency divider 270 divides the frequency of the third clock signal CLK3 to generate the fourth clock signal CLK4. The detector circuit 250 is coupled to the charge pump 220 and the VCO 240. The detector circuit 250 sends a pulse signal PSS to restart the VCO 240 when the control voltage VCP conforms to a preset condition.

When the power supply of the PLL 200 is turned on, a power down signal PD is sent to reset the PLL 200 and starts up the VCO 240 initially in order to avoid the non-oscillating mode of the PLL 200. The VCO 240 restarts itself upon receiving the power down signal PD or the pulse signal PSS.

The aforementioned preset condition is that the control voltage VCP becomes higher than a first threshold voltage VB and then becomes lower than or equal to a second threshold voltage VC. The first threshold voltage VB is higher than the second threshold voltage VC. It is possible that the PLL 200 enters the non-oscillating mode in runtime after the initial reset. When the non-oscillating mode is pending, as a sign foreboding the non-oscillating mode, the control voltage VCP gets higher and higher. This characteristic can be used to detect the non-oscillating mode. Therefore, the voltage VB is the high threshold associated with the non-oscillating mode. The voltage VC is the low threshold for the proper restart of the VCO 240. When the control voltage VCP is lower than or equal to the second threshold voltage VC, the VCO 240 can resume the normal oscillation. As discussed later, the detector circuit 250 is capable of pulling down the control voltage VCP from the first threshold voltage VB to the second threshold voltage VC.

The detector circuit 250 includes a restoration circuit 252, a peak detector 254, and a pulse generator 256. The peak detector 254 is coupled to the charge pump 220. The peak detector 254 asserts or de-asserts an activation signal AT according to a comparison of the control voltage VCP, the first threshold voltage VB, and the second threshold voltage VC. The restoration circuit 252 is coupled to the peak detector 254 and the charge pump 220. The restoration circuit 252 pulls down the control voltage VCP when the activation signal AT is asserted. In this embodiment, the restoration circuit 252 pulls down the control voltage VCP by drawing a current from the charge pump 220. The pulse generator 256 is coupled to the peak detector 254 and the VCO 240. The pulse generator 256 sends the pulse signal PSS to restart the VCO 240 in response to a de-assertion of the activation signal AT.

Figure 3:
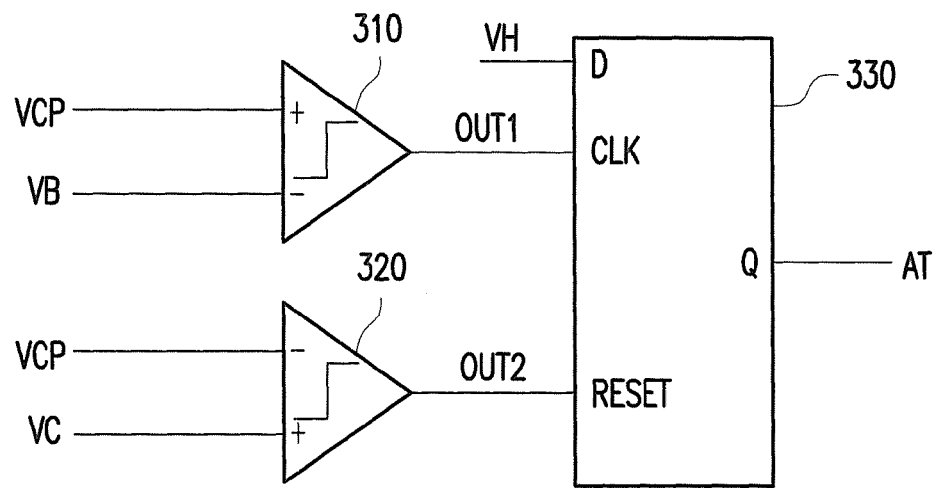
FIG. 3 schematically illustrates a peak detector of a PLL according to an embodiment of this invention.

FIG. 3 schematically illustrates the peak detector 254 of the detector circuit 250 of the PLL 200 according to an embodiment of this invention. The peak detector 254 in this embodiment includes a first comparator 310, a second comparator 320, and a D flip-flop 330. The first comparator 310 is coupled to the charge pump 220. The first comparator 310 generates a first output signal OUT1 according to a comparison of the control voltage VCP and the first threshold voltage VB. The second comparator 320 is coupled to the charge pump 220. The second comparator 320 generates a second output signal OUT2 according to a comparison of the control voltage VCP and the second threshold voltage VC. The D flip-flop 330 is coupled to the first comparator 310, the second comparator 320, the restoration circuit 252, and the pulse generator 256. The D flip-flop 330 includes a data terminal D, a clock terminal CLK, a reset terminal RESET, and an output terminal Q. The data terminal D receives a logic-high voltage VH. The clock terminal CLK receives the first output signal OUT1. The reset terminal RESET receives the second output signal OUT2. The output terminal Q outputs the activation signal AT to the restoration circuit 252 and the pulse generator 256.

Figure 4:
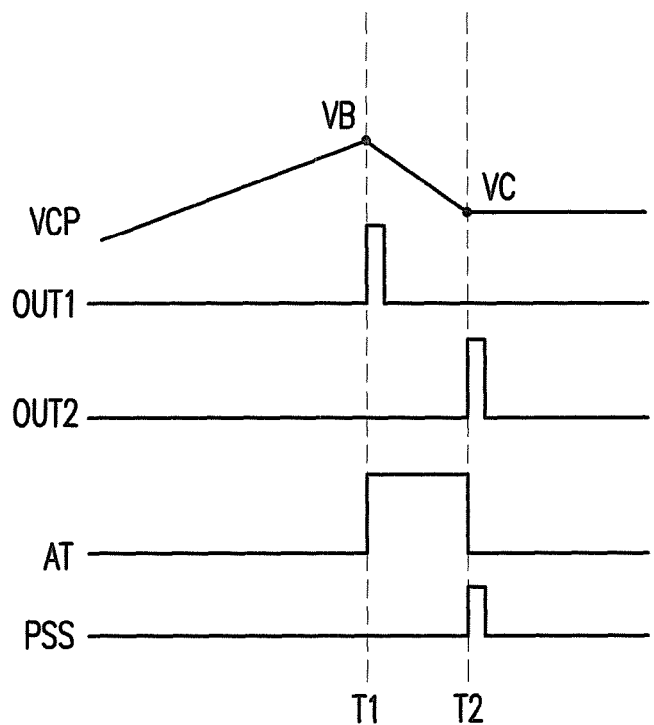
FIG. 4 schematically illustrates signals related to a peak detector of a PLL according to an embodiment of this invention.

FIG. 4 schematically illustrates the control voltage VCP, the output signals OUT1 and OUT2, the activation signal AT, and the pulse signal PSS in this embodiment. When the non-oscillating mode is pending, the control voltage VCP output by the charge pump 220 gets higher and higher. At the moment T1, the control voltage VCP becomes higher than the first threshold voltage VB, which means the PLL 200 is already in the non-oscillating mode. The first comparator 310 asserts the first output signal OUT1 when the control voltage VCP becomes higher than the first threshold voltage VB. The asserted output signal OUT1 triggers the D flip-flop 330. Consequently, the D flip-flop 330 asserts the activation signal AT because the data terminal D receives the logic-high voltage VH.

The restoration circuit 252 pulls down the control voltage VCP when the activation signal AT is asserted. As shown in FIG. 4, the activation signal AT is asserted in the time duration from the moment T1 to the moment T2. In response to the assertion, the restoration circuit 252 pulls down the control voltage VCP in the time duration from the moment T1 to the moment T2. At the moment T2, the control voltage VCP becomes equal to the second threshold voltage VC. The second comparator 320 asserts the second output signal OUT2 when the control voltage VCP becomes lower than or equal to the second threshold voltage VC. The asserted output signal OUT2 resets the D flip-flop 330. Consequently, the D flip-flop 330 de-asserts the activation signal AT. In response to the de-assertion, the pulse generator 256 sends the pulse signal PSS to restart the VCO 240 to leave the non-oscillating mode and resume normal oscillation.

Figure 5:
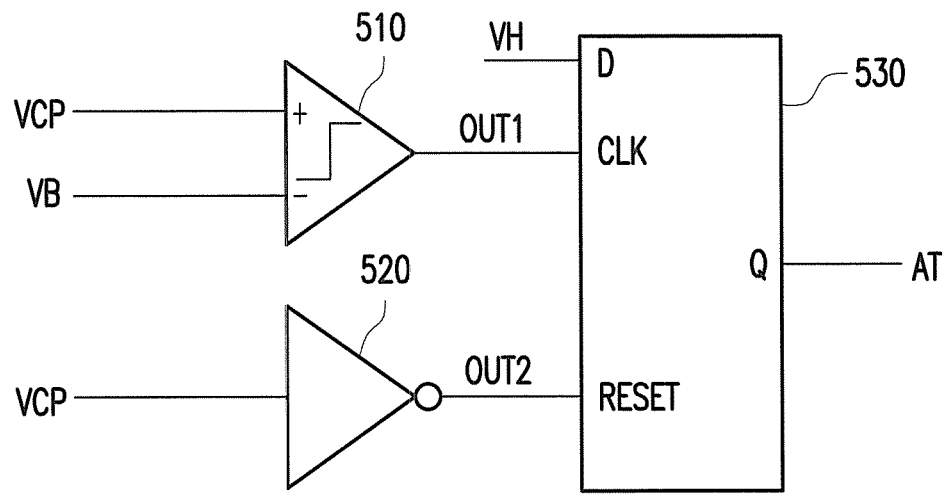
FIG. 5 schematically illustrates a peak detector of a PLL according to an embodiment of this invention.

FIG. 5 schematically illustrates the peak detector 254 of the detector circuit 250 of the PLL 200 according to an embodiment of this invention. The peak detector 254 in this embodiment includes a comparator 510, an inverter 520, and a D flip-flop 530. The comparator 510 is coupled to the charge pump 220. The comparator 510 is identical to the comparator 310. The inverter 520 is coupled to the charge pump 220. The inverter 520 generates the second output signal OUT2 according to the control voltage VCP. The D flip-flop 530 is coupled to the comparator 510, the inverter 520, the restoration circuit 252, and the pulse generator 256. The D flip-flop 530 is identical to the D flip-flop 330.

The switching threshold voltage of the inverter 520 is the second threshold voltage VC, which means the inverter 520 asserts the second output signal OUT2 when the control voltage VCP becomes lower than or equal to the second threshold voltage VC. The inverter 520 can be used as a replacement of the comparator 320. Therefore, when the control voltage VCP gets higher and higher, the following behaviors of the signals VCP, OUT1, OUT2, AT and PSS in this embodiment are exactly the same as those depicted in FIG. 4.

Figure 6:
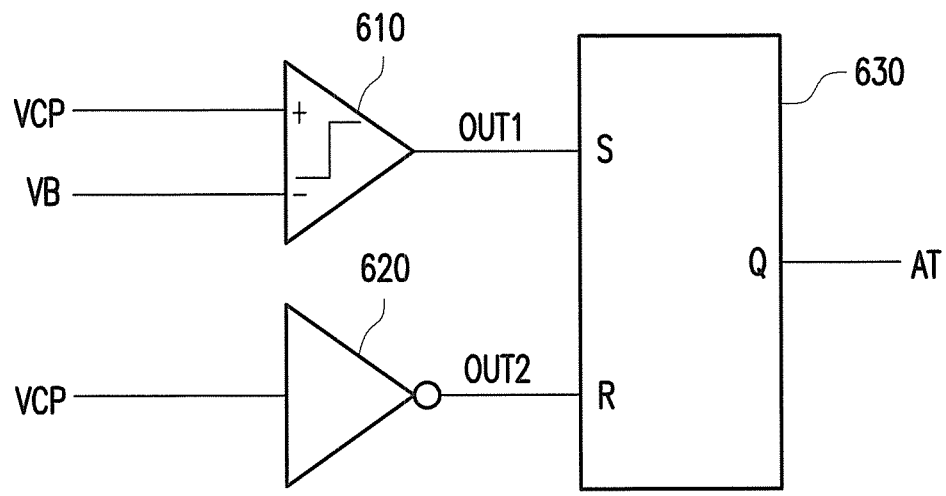
FIG. 6 schematically illustrates a peak detector of a PLL according to an embodiment of this invention.

FIG. 6 schematically illustrates the peak detector 254 of the detector circuit 250 of the PLL 200 according to an embodiment of this invention. The peak detector 254 in this embodiment includes a comparator 610, an inverter 620, and a set-reset latch (SR latch) 630. The comparator 610 is coupled to the charge pump 220. The comparator 610 is identical to the comparator 310. The inverter 620 is coupled to the charge pump 220. The inverter 620 is identical to the inverter 520. The set-reset latch 630 is coupled to the comparator 610, the inverter 620, the restoration circuit 252, and the pulse generator 256. The set-reset latch 630 includes a set terminal S, a reset terminal R, and an output terminal Q. The set terminal S receives the first output signal OUT1. The reset terminal R receives the second output signal OUT2. The output terminal Q outputs the activation signal AT to the restoration circuit 252 and the pulse generator 256. It can be derived from the circuit shown in FIG. 6 that, when the control voltage VCP gets higher and higher, the following behaviors of the signals VCP, OUT1, OUT2, AT and PSS in this embodiment are exactly the same as those depicted in FIG. 4.

Figure 7:
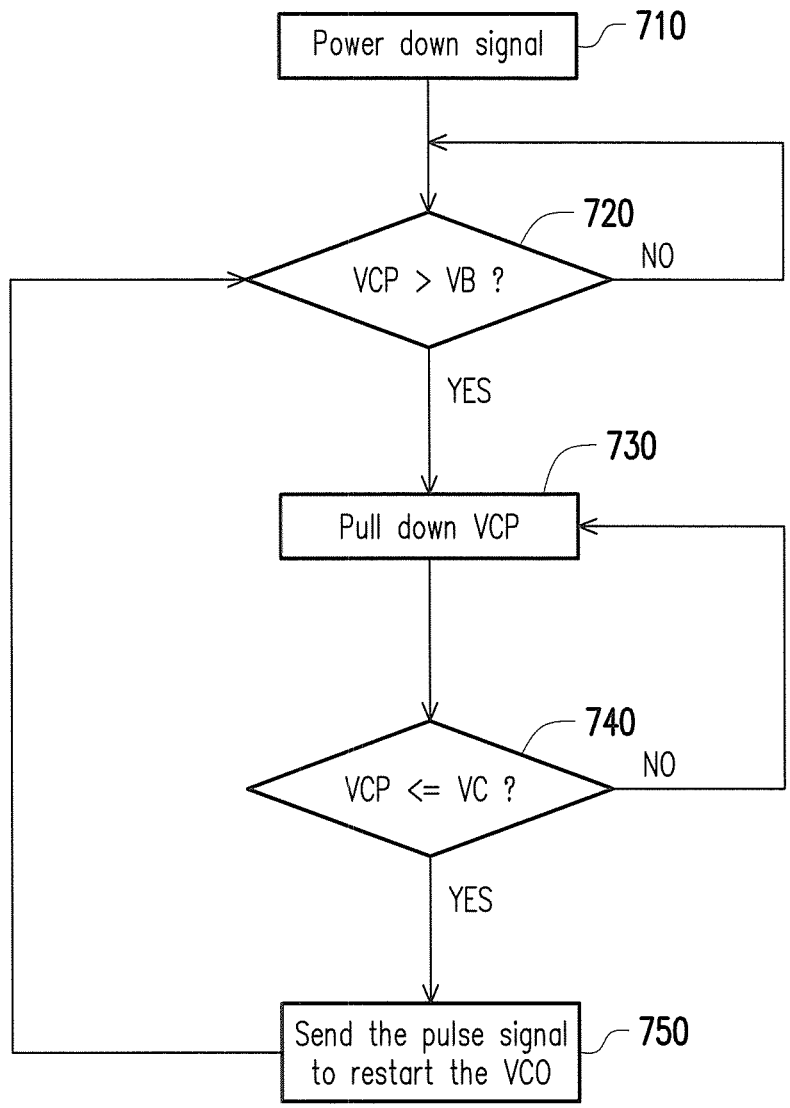
FIG. 7 schematically illustrates the flow of a method for controlling a PLL according to an embodiment of this invention.

FIG. 7 schematically illustrates the flow of a method for controlling a PLL according to an embodiment of this invention. This method may be executed by the PLL 200. In step 710, the power supply of the PLL 200 is turned on and the charge pump 220, the low-pass filter 230, and the VCO 240 are initialized and started in response to the power down signal PD. In step 720, the peak detector 254 checks whether the control voltage VCP is higher than the first threshold voltage VB or not. The flow returns to step 720 when the control voltage VCP is not higher than the first threshold voltage VB. The peak detector 254 asserts the activation signal AT when the control voltage VCP is higher than the first threshold voltage VB. In response to this assertion, the restoration circuit 252 pulls down the control voltage VCP in step 730.

In step 740, the peak detector 254 checks whether or not the control voltage VCP is lower than or equal to the second threshold voltage VC. The flow returns to step 730 when the control voltage VCP is higher than the second threshold voltage VC. The peak detector 254 de-asserts the activation signal AT when the control voltage VCP is lower than or equal to the second threshold voltage VC. In response to this de-assertion, the pulse generator 256 sends the pulse signal PSS to restart the VCO 240 in step 750. Next, the flow returns to step 720.

In summary, the internal detector circuit of the PLL provided by this invention monitors the control voltage output by the charge pump. The detector circuit can pull down the control voltage when the control voltage is high enough to indicate the non-oscillating mode, and then the detector circuit can restart the VCO of the PLL when the control voltage is low enough to ensure the normal oscillation of the VCO. Since the control voltage is an internal signal of the PLL, the detector circuit can restart the VCO in quick response, which solves the problem of the slow response of the external power down signal.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A phase-locked loop (PLL), comprising:
   a phase detector, generating a direction signal according to a comparison between phases of a first clock signal and a second clock signal;
   a charge pump, coupled to the phase detector, converting the direction signal into a control voltage;
   a voltage-controlled oscillator (VCO), coupled to the charge pump, generating a third clock signal, wherein the control voltage controls a frequency of the third clock signal;
   a feedback frequency divider, coupled to the phase detector and the VCO, dividing the frequency of the third clock signal to generate the second clock signal; and
   a detector circuit, coupled to the charge pump and the VCO, sending a pulse signal to restart the VCO when the control voltage conforms to a preset condition.

2. The PLL of claim 1, wherein the preset condition is that the control voltage becomes higher than a first threshold voltage and then becomes lower than or equal to a second threshold voltage, wherein the first threshold voltage is higher than the second threshold voltage.

3. The PLL of claim 2, wherein the detector circuit starts pulling down the control voltage when the control voltage is higher than the first threshold voltage, and then the detector circuit pulls down the control voltage until the control voltage is lower than or equal to the second threshold voltage.

4. The PLL of claim 2, wherein the detector circuit comprises:
   a peak detector, coupled to the charge pump, asserting or de-asserting an activation signal according to a comparison of the control voltage, the first threshold voltage, and the second threshold voltage;
   a restoration circuit, coupled to the peak detector and the charge pump, pulling down the control voltage when the activation signal is asserted; and
   a pulse generator, coupled to the peak detector and the VCO, sending the pulse signal to restart the VCO in response to a de-assertion of the activation signal.

5. The PLL of claim 4, wherein the peak detector comprises:
   a first comparator, coupled to the charge pump, generating a first output signal according to a comparison of the control voltage and the first threshold voltage;
   a second comparator, coupled to the charge pump, generating a second output signal according to a comparison of the control voltage and the second threshold voltage; and
   a D flip-flop, coupled to the first comparator, the second comparator, the restoration circuit, and the pulse generator, comprising a data terminal, a clock terminal, a reset terminal, and an output terminal, wherein the data terminal receives a logic-high voltage, the clock terminal receives the first output signal, the reset terminal receives the second output signal, and the output terminal outputs the activation signal.

6. The PLL of claim 4, wherein the peak detector comprises:
   a comparator, coupled to the charge pump, generating a first output signal according to a comparison of the control voltage and the first threshold voltage;
   an inverter, coupled to the charge pump, generating a second output signal according to the control voltage, wherein a switching threshold voltage of the inverter is the second threshold voltage; and
   a D flip-flop, coupled to the comparator, the inverter, the restoration circuit, and the pulse generator, comprising a data terminal, a clock terminal, a reset terminal, and an output terminal, wherein the data terminal receives a logic-high voltage, the clock terminal receives the first output signal, the reset terminal receives the second output signal, and the output terminal outputs the activation signal.

7. The PLL of claim 4, wherein the peak detector comprises:
   a comparator, coupled to the charge pump, generating a first output signal according to a comparison of the control voltage and the first threshold voltage;
   an inverter, coupled to the charge pump, generating a second output signal according to the control voltage, wherein a switching threshold voltage of the inverter is the second threshold voltage; and
   a set-reset latch, coupled to the comparator, the inverter, the restoration circuit, and the pulse generator, comprising a set terminal, a reset terminal, and an output terminal, wherein the set terminal receives the first output signal, the reset terminal receives the second output signal, and the output terminal outputs the activation signal.

8. The PLL of claim 4, wherein the restoration circuit pulls down the control voltage by drawing a current from the charge pump.

9. A method for controlling a phase-locked loop (PLL), comprising:
   generating a direction signal according to a comparison between phases of a first clock signal and a second clock signal;
   converting the direction signal into a control voltage, wherein the control voltage controls a frequency of a third clock signal generated by a voltage-controlled oscillator (VCO) of the PLL;
   dividing the frequency of the third clock signal to generate the second clock signal; and
   sending a pulse signal to restart the VCO when the control voltage conforms to a preset condition.

10. The method of claim 9, wherein the preset condition is that the control voltage becomes higher than a first threshold voltage and then becomes lower than or equal to a second threshold voltage, wherein the first threshold voltage is higher than the second threshold voltage.

11. The method of claim 10, further comprising:
starting pulling down the control voltage when the control voltage is higher than the first threshold voltage, and then pulling down the control voltage until the control voltage is lower than or equal to the second threshold voltage.

12. The method of claim 10, wherein the step of sending the pulse signal to restart the VCO comprises:
asserting or de-asserting an activation signal according to a comparison of the control voltage, the first threshold voltage, and the second threshold voltage;
pulling down the control voltage when the activation signal is asserted; and
sending the pulse signal to restart the VCO in response to a de-assertion of the activation signal.

* * * * *